US012666726B2

(12) United States Patent
Zheng et al.

(10) Patent No.:  US 12,666,726 B2
(45) Date of Patent:      Jun. 23, 2026

(54) DEEP TRENCH ISOLATION STRUCTURES FOR A SINGLE-PHOTON AVALANCHE DIODE

(71) Applicant: GlobalFoundries Singapore Pte. Ltd., Singapore (SG)

(72) Inventors: Ping Zheng, Singapore (SG); Eng Huat Toh, Singapore (SG); Kiok Boone Elgin Quek, Singapore (SG)

(73) Assignee: GlobalFoundries Singapore Pte. Ltd., Singapore (SG)

( * ) Notice: Subject to any disclaimer, the term of this patent is extended or adjusted under 35 U.S.C. 154(b) by 428 days.

(21) Appl. No.: 18/384,948

(22) Filed: Oct. 30, 2023

(65) Prior Publication Data

US 2025/0142984 A1      May 1, 2025

(51) Int. Cl.
*H10F 30/225*        (2025.01)
*H10F 71/00*         (2025.01)
*H10F 77/14*         (2025.01)

(52) U.S. Cl.
CPC ......... *H10F 30/225* (2025.01); *H10F 71/121* (2025.01); *H10F 77/14* (2025.01)

(58) Field of Classification Search
CPC ....... H10F 30/225; H10F 71/121; H10F 77/14
USPC ........................................................ 257/186
See application file for complete search history.

(56) References Cited

U.S. PATENT DOCUMENTS

| 11,784,196 | B2 | 10/2023 | Zheng et al. | |
| 2022/0359580 | A1* | 11/2022 | Zheng | H10F 39/8033 |
| 2023/0065063 | A1* | 3/2023 | Zheng | H10F 39/024 |
| 2023/0131505 | A1* | 4/2023 | Linardy | H10F 39/011 |
| | | | | 257/432 |

OTHER PUBLICATIONS

Vines, Peter et al., "High performance planar germanium-on-silicon single-photon avalanche diode detectors." Nature Communications. 10. 1086. 10.1038/s41467-019-08830-w. (2019).
Zheng, Ping et al., "Trenchless Single-Photon Avalanche Diodes" filed on Aug. 22, 2023 as a U.S. Appl. No. 18/236,484.

* cited by examiner

*Primary Examiner* — Igwe U Anya
(74) *Attorney, Agent, or Firm* — Thompson Hine LLP; Anthony Canale

(57)                  ABSTRACT
Structures for a single-photon avalanche diode and methods of forming a structure for a single-photon avalanche diode. The structure comprises a semiconductor layer on a top surface of a semiconductor substrate, a light-absorbing layer on a first portion of the semiconductor layer, a dielectric layer on a second portion of the semiconductor layer, and a doped region in the semiconductor substrate adjacent to the semiconductor layer. The structure further comprises a deep trench isolation structure that penetrates through the dielectric layer and the second portion of the semiconductor layer to the doped region. The deep trench isolation structure includes a conductor layer and a dielectric liner, the dielectric liner includes a portion between the conductor layer and the semiconductor layer, and the conductor layer is connected to the first doped region.

20 Claims, 3 Drawing Sheets

DEEP TRENCH ISOLATION STRUCTURES FOR A SINGLE-PHOTON AVALANCHE DIODE

BACKGROUND

The disclosure relates to semiconductor device fabrication and integrated circuits and, more specifically, to structures for a single-photon avalanche diode and methods of forming a structure for a single-photon avalanche diode.

A single-photon avalanche diode is a type of solid-state photodetector belonging to the same device family as photodiodes and avalanche photodiodes. A fundamental difference between single-photon avalanche diodes and other types of photodetectors is that a single-photon avalanche diode is biased well above its reverse-bias breakdown voltage. When a single-photon avalanche diode is placed under such a high reverse bias, photon-initiated carriers are accelerated by the electric field to a kinetic energy that is sufficient to eject electrons out of atoms of the bulk material constituting the absorption region of the single-photon avalanche diode. A large avalanche of carriers grows exponentially and can be triggered in the bulk material by as few as a single photon-initiated carrier that is accelerated by the electric field. A single-photon avalanche diode can detect single photons providing short duration current pulses that can be counted or used to obtain a time of arrival for an incident single photon.

A patterned germanium layer may supply the bulk material for the absorption region of the single-photon avalanche diode. The germanium layer may be epitaxially grown from a substrate and then patterned to shape. An anode is formed in the patterned germanium layer. The topography of the patterned germanium layer results in the anode contact landing on the anode having a shorter height than the cathode contact landing on a portion of the substrate adjacent to the patterned germanium layer. The magnitude of the height difference requires the use of separate masks during lithography and separate etch and deposition processes to form the anode contact and the cathode contact.

Improved structures for a single-photon avalanche diode and methods of forming a structure for a single-photon avalanche diode are needed.

SUMMARY

In an embodiment of the invention, a structure for a single-photon avalanche detector is provided. The structure comprises a semiconductor layer on a top surface of a semiconductor substrate, a light-absorbing layer on a first portion of the semiconductor layer, a dielectric layer on a second portion of the semiconductor layer, and a doped region in the semiconductor substrate adjacent to the semiconductor layer. The structure further comprises a deep trench isolation structure that penetrates through the dielectric layer and the second portion of the semiconductor layer to the doped region. The deep trench isolation structure includes a conductor layer and a dielectric liner, the dielectric liner includes a portion between the conductor layer and the semiconductor layer, and the conductor layer is connected to the first doped region.

In an embodiment of the invention, a method of forming a structure for a single-photon avalanche detector is provided. The method comprises forming a semiconductor layer on a top surface of a semiconductor substrate, forming a light-absorbing layer on a first portion of the semiconductor layer, forming a dielectric layer on a second portion of the semiconductor layer, and forming a doped region in the semiconductor substrate adjacent to the semiconductor layer. The method further comprises forming a deep trench isolation structure that penetrates through the dielectric layer and the second portion of the semiconductor layer to the doped region. The deep trench isolation structure includes a conductor layer and a dielectric liner, the dielectric liner includes a portion between the conductor layer and the semiconductor layer, and the conductor layer is connected to the first doped region.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figures 1, 2:
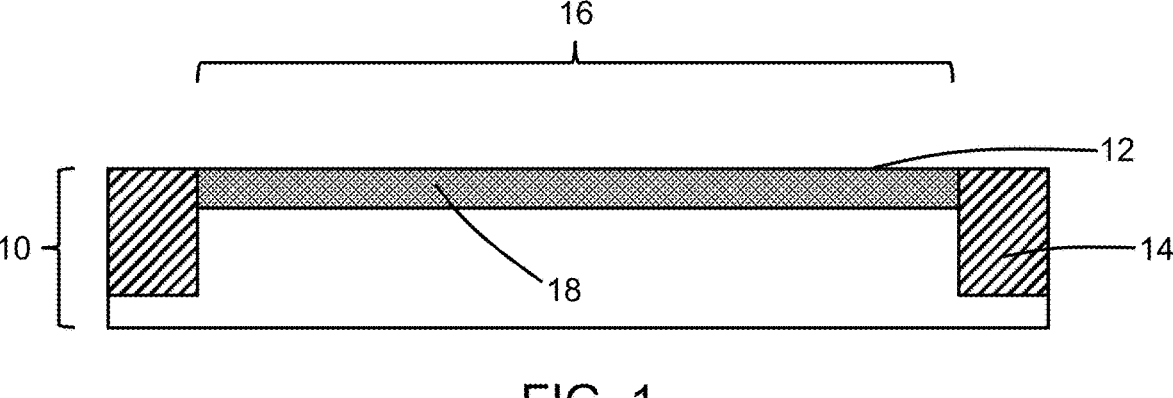
FIGS. 1-5 are cross-sectional views of a structure at successive fabrication stages of a processing method in accordance with embodiments of the invention.

With reference to FIG. 1 and in accordance with embodiments of the invention, a semiconductor substrate 10 is provided that is comprised of a semiconductor material, such as single-crystal silicon. In an embodiment, the semiconductor substrate 10 may contain semiconductor material that is lightly-doped with a p-type dopant, such as boron, to provide p-type electrical conductivity. A shallow trench isolation region 14 is formed that extends from a top surface 12 of the semiconductor substrate 10 to a shallow depth into the semiconductor substrate 10. The shallow trench isolation region 14 may comprise a dielectric material, such as silicon dioxide, that is an electrical insulator and that is deposited by chemical vapor deposition into a trench patterned in the semiconductor substrate 10, polished, and deglazed. The shallow trench isolation region 14 surrounds a portion of the semiconductor substrate 10 to define an active device region 16 of semiconductor material.

A doped region 18 is formed in the semiconductor substrate 10 across the entirety of the active device region 16. The doped region 18 may extend from the top surface 12 of the semiconductor substrate 10 to a given depth into the semiconductor substrate 10. The doped region 18 may be formed by, for example, a blanket ion implantation process that does not require an implantation mask. The implantation conditions, such as ion species, dose, and kinetic energy, may be selected to tune the electrical and physical characteristics of the doped region 18. In an embodiment, the semiconductor material of the doped region 18 may receive and contain an n-type dopant, such as arsenic or phosphorus, that provides n-type electrical conductivity. In an embodiment, the semiconductor material of the doped region 18 may be heavily doped with the n-type dopant.

With reference to FIG. 2 in which like reference numerals refer to like features in FIG. 1 and at a subsequent fabrication stage of the processing method, a semiconductor layer 20 is formed with a given thickness T1 on the top surface 12 of the semiconductor substrate 10 and on the shallow trench isolation region 14. The semiconductor layer 20 may be comprised of a semiconductor material, such as single-crystal silicon, that is epitaxially grown as a blanket film using an epitaxial growth process. In an embodiment, the semiconductor layer 20 may comprise an intrinsic semiconductor material, such as intrinsic silicon, that is undoped. In an embodiment, the thickness T1 of the semiconductor layer 20 may be approximately equal to about 1 micron. A bottom surface 19 of the semiconductor layer 20 may be positioned on the top surface 12 of the semiconductor substrate 10. In an embodiment, the bottom surface 19 of the semiconductor layer 20 may be disposed in direct contact with the top surface 12 of the semiconductor substrate 10. The semiconductor layer 20 and the doped region 18 adjoin at the top surface 12 of the semiconductor substrate 10.

A doped region 22 is formed in a portion of the semiconductor layer 20 adjacent to a top surface 21 of the semiconductor layer 20. The doped region 22 may be formed by, for example, selective ion implantation process using an implantation mask with an opening that determines a portion of the semiconductor layer 20 targeted to be implanted. The implantation mask may include a layer of a light-sensitive material, such as a photoresist, applied by a spin-coating process, pre-baked, exposed to light projected through a photomask, baked after exposure, and developed with a chemical developer to define the opening. The implantation conditions, such as ion species, dose, and kinetic energy, may be selected to tune the electrical and physical characteristics of the doped region 22. The implantation mask, which has a thickness adequate to stop the ions, may be stripped after forming the doped region 22. In an embodiment, the semiconductor material of the doped region 22 may receive and contain a p-type dopant, such as boron, that provides p-type electrical conductivity.

Figures 3, 4:
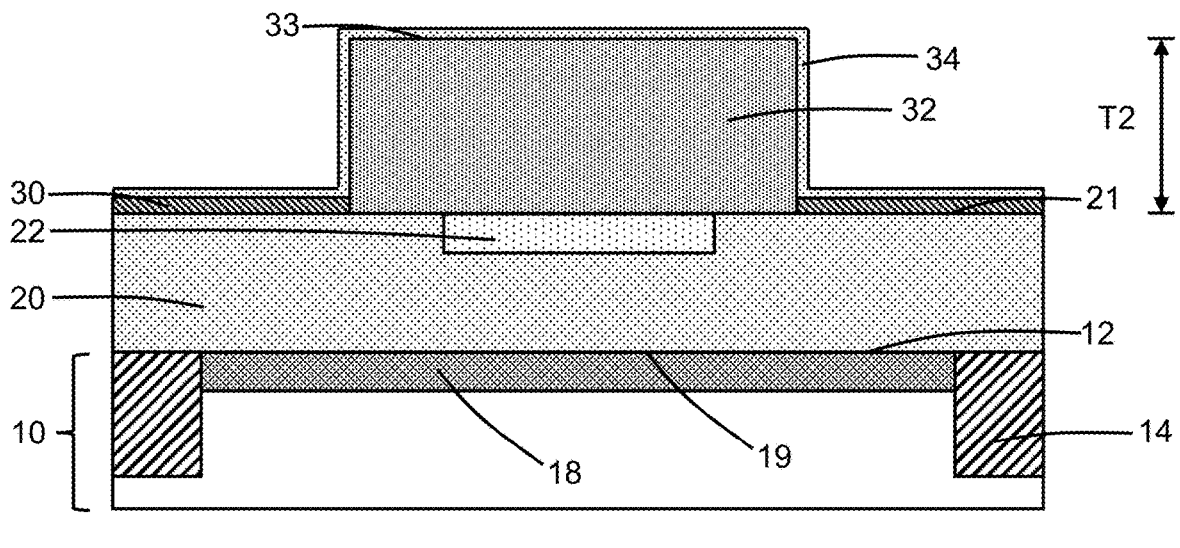

With reference to FIG. 3 in which like reference numerals refer to like features in FIG. 2 and at a subsequent fabrication stage of the processing method, a dielectric layer 30 is formed and patterned by lithography and etching processes to define an opening over the doped region 22 in the semiconductor layer 20. The dielectric layer 30 may be comprised of, for example, silicon nitride. The opening in the dielectric layer 30 exposes a portion of the top surface 21 of the semiconductor layer 20 that is larger in surface area than the surface area of the doped region 22.

A light-absorbing layer 32 may be formed on the portion of the semiconductor layer 20 inside the opening in the dielectric layer 30 and using the patterned dielectric layer 30 as a hardmask. The doped region 22 is positioned in the portion of the semiconductor layer 20 adjacent to the light-absorbing layer 32. The light-absorbing layer 32 may be formed with a given thickness T2 on the portion of the semiconductor layer 20 by an epitaxial growth process. In an embodiment, the light-absorbing layer 32 may be formed by a selective epitaxial growth process in which semiconductor material nucleates for epitaxial growth from the exposed portion of the top surface 21 of the semiconductor layer 20, but does not nucleate for epitaxial growth from the dielectric layer 30. In an embodiment, the thickness T2 of the light-absorbing layer 32 may be approximately 1 micron. The light-absorbing layer 32 may grow with either vertical or substantially vertical sidewalls and/or sidewalls that are inclined. The light-absorbing layer 32 has a top surface 33 and an opposite bottom surface that is coextensive with the contacted portion of the top surface 21 of the semiconductor layer 20.

The light-absorbing layer 32 may be comprised of a material that converts absorbed light into charge carriers. In an embodiment, the light-absorbing layer 32 may comprise a material having a composition that includes germanium. In an embodiment, the light-absorbing layer 32 may comprise a material having a composition that exclusively includes elemental germanium. The dielectric layer 30 and light-absorbing layer 32 may be covered by a cap layer 34 having a different composition, such as intrinsic silicon, than the light-absorbing layer 32.

With reference to FIG. 4 in which like reference numerals refer to like features in FIG. 3 and at a subsequent fabrication stage of the processing method, a dielectric layer 38 is formed on a portion of the top surface 21 of the semiconductor layer 20 different from the portion of the top surface 21 on which the light-absorbing layer 32 is formed. The dielectric layer 38 may be comprised of a dielectric material, such as silicon dioxide, that is an electrical insulator. The dielectric layer 38 may be deposited and planarized to remove topography created by the light-absorbing layer 32 such that a top surface 39 of the dielectric layer 38 is coplanar with the top surface 33 of the light-absorbing layer 32.

A deep trench isolation structure 25 is formed that is coupled to the doped region 18. To that end, a trench 24 is formed that extends as an opening from the top surface 39 of the dielectric layer 38 fully through the dielectric layer 38, fully through the dielectric layer 30, and fully through the semiconductor layer 20 to the doped region 18 in the semiconductor substrate 10. In an embodiment, the deep trench isolation structure 25 may be positioned fully over the top surface 12 of the semiconductor substrate 10 such that the semiconductor substrate 10 is not penetrated. In an embodiment, the deep trench isolation structure 25 may fully surround a portion of the semiconductor layer 20 defining a multiplication region of a single-photon avalanche diode. The light-absorbing layer 32 may define an absorption region of the single-photon avalanche diode. In an embodiment, the deep trench isolation structure 25 may fully surround the multiplication region and the absorption region.

The trench 24 may be patterned by lithography and etching processes. To that end, an etch mask is formed by a lithography process over the light-absorbing layer 32 and dielectric layer 38. The etch mask may include a layer of a light-sensitive material, such as a photoresist, applied by a spin-coating process, pre-baked, exposed to light projected through a photomask, baked after exposure, and developed with a chemical developer to define an opening arranged over stacked portions of the dielectric layer 38 and the semiconductor layer 20 targeted to be etched to define the trench 24. An etching process is used to form the trench 24 at the location of the opening in the etch mask. The etch mask may be stripped after forming the trench 24. The trench 24 may have a top portion that is coextensive with the top surface 39 of the dielectric layer 38 and a bottom portion that is coextensive with the top surface 12 of the semiconductor substrate 10.

The deep trench isolation structure 25 includes a conductor layer 28 and a dielectric liner 26 with a lower portion that is disposed between the conductor layer 28 and the semiconductor layer 20 and an upper portion that is disposed between the conductor layer 28 and the dielectric layer 38. In an embodiment, the dielectric liner 26 may include sections that are formed on the inner and outer sidewalls of the trench 24, and the conductor layer 28 may be formed as a core between the section of the dielectric liner 26 on the inner sidewall of the trench 24 and a section of the dielectric liner 26 on the outer sidewall of the trench 24. The conductor layer 28 has a lower portion that is disposed inside the semiconductor layer 20 and an upper portion that is disposed inside the dielectric layer 38. The lower portion of the dielectric liner 26 is disposed on the inner and outer sidewalls of the trench 24 between the lower portion of the conductor layer 28 and the semiconductor layer 20. The upper portion of the dielectric liner 26 is disposed on the inner and outer sidewalls of the trench 24 between the upper portion of the conductor layer 28 and the dielectric layer 38.

The dielectric liner 26 may be comprised of a dielectric material, such as silicon dioxide, that is an electrical insulator, and the conductor layer 28 may be comprised of polycrystalline silicon (polysilicon) doped with an n-type dopant, such as arsenic or phosphorus, that provides n-type electrical conductivity. In alternative embodiments, the conductor layer 28 may be comprised of a metal, a combination of doped polysilicon and metal, or other combinations of materials that are electrical conductors. A portion of the dielectric liner 26 may be removed by an etching process from the bottom of the trench 24 to expose a portion of the doped region 18 before forming the conductor layer 28. The conductor layer 28 provides a conductive path extending from the top surface 39 of the dielectric layer 38 to the doped region 18 in the semiconductor substrate 10.

The conductor layer 28 of the deep trench isolation structure 25 may have a top surface 29. In an embodiment, the top surface 29 of the conductor layer 28 of the deep trench isolation structure 25 may be coplanar with the top surface 33 of the light-absorbing layer 32 and coplanar with the top surface 39 of the dielectric layer 38. In an embodiment, the top surface 29 of the conductor layer 28 of the deep trench isolation structure 25 may be substantially coplanar with the top surface 33 of the light-absorbing layer 32 and substantially coplanar with the top surface 31 of the dielectric layer 38. The cap layer 34 may contribute to a slight height differential between the top surface 29 of the conductor layer 28 and the top surface 33 of the light-absorbing layer 32.

The single-photon avalanche diode including the light-absorbing layer 32 may be deployed in an array of single-photon avalanche diodes. The deep trench isolation structure 25 may provide optical confinement that is effective to reduce optical crosstalk between neighboring single-photon avalanche diodes in the array.

Figure 5:
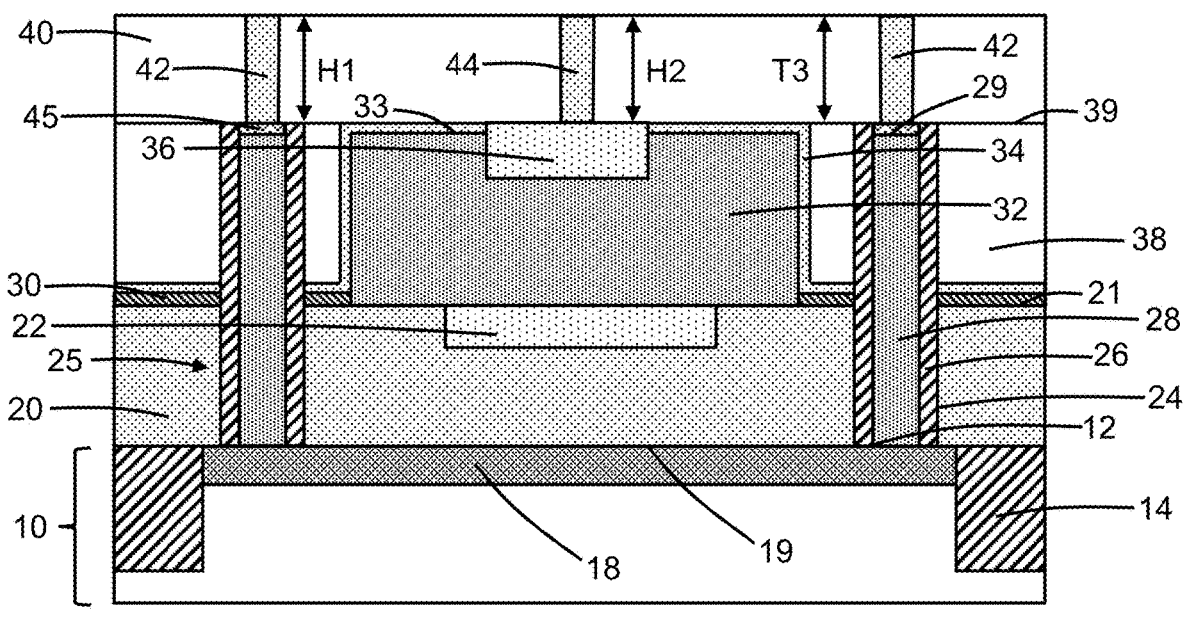

With reference to FIG. 5 in which like reference numerals refer to like features in FIG. 4 and at a subsequent fabrication stage of the processing method, a doped region 36 may be formed in a section of the cap layer 34 and an adjacent underlying section of the light-absorbing layer 32. In an embodiment, the doped region 36 may be formed in sections of the light-absorbing layer 32 and cap layer 34 within a central portion of the active device region 16. In an embodiment, the doped region 36 may be centered over the doped region 22 in the semiconductor layer 20.

The doped region 36 may be formed by, for example, an ion implantation process using an implantation mask with an opening that determines an implanted area for the cap layer 34 and the adjacent section of the light-absorbing layer 32. The implantation mask may include a layer of a light-sensitive material, such as a photoresist, applied by a spin-coating process, pre-baked, exposed to light projected through a photomask, baked after exposure, and developed with a chemical developer to define the opening. The implantation conditions, such as ion species, dose, and kinetic energy, may be selected to tune the electrical and physical characteristics of the doped region 36. The implantation mask may be stripped after forming the doped region 36. In an embodiment, the semiconductor material of the doped region 36 may receive and contain a p-type dopant, such as boron, that provides p-type electrical conductivity.

In an embodiment, the semiconductor material of the doped region 36 may be heavily doped with the p-type dopant.

Middle-of-line processing and back-end-of-line processing follow, which includes formation of silicide, contacts, vias, and wiring for an interconnect structure that is coupled to the single-photon avalanche diode. An interlayer dielectric layer 40 comprised of, for example, silicon dioxide may be deposited and then patterned to open the conductor layer 28 in the trench 24 for the formation of a silicide layer 45. Contacts 42 may be formed that penetrate through the interlayer dielectric layer 40. The contacts 42 are electrically and physically connected by the silicide layer 45 and the conductor layer 28 of the deep trench isolation structure 25 to the doped region 18. One or more contacts 44 may be formed that penetrate through the interlayer dielectric layer 40 to be electrically and physically connected to the doped region 36.

The silicide layer 45 may consume a thickness of the semiconductor material of the conductor layer 28 during the silicidation process and recess the top surface 29 of the conductor layer 28. The recessing of the conductor layer 28 due to consumption of its semiconductor material may contribute to a height differential between the top surface 29 of the conductor layer 28 and the top surface 33 of the light-absorbing layer 32. In an embodiment, the top surface 29 of the conductor layer 28 of the deep trench isolation structure 25 may be coplanar with the top surface 33 of the light-absorbing layer 32 and the top surface 31 of the dielectric layer 30 after forming the silicide layer 45. In an embodiment, the top surface 29 of the conductor layer 28 of the deep trench isolation structure 25 may be substantially coplanar with the top surface 33 of the light-absorbing layer 32 and the top surface 31 of the dielectric layer 30 after forming the silicide layer 45.

The contacts 42 may have a height H1 relative to the top surface 29 of the conductor layer 28, and the one or more contacts 44 may have a height H2 relative to the top surface 33 of the light-absorbing layer 32. In an embodiment, the height H1 may be equal to the height H2. In an embodiment, the height H1 may be substantially equal to the height H2. In an embodiment, the silicide layer 45 may introduce a slight height differential between the top surface 29 and the top surface 33. In an embodiment, the cap layer 34 may introduce a slight height differential between the height H1 and the height H2. The interlayer dielectric layer 40 may have a thickness T3, the height H1 may be equal or substantially equal to the thickness T3, and the height H2 may be equal or substantially equal to the thickness T3.

The doped region 18 may supply a cathode of the single-photon avalanche diode, and the doped region 36 may supply an anode of the single-photon avalanche diode. The conductor layer 28 of the deep trench isolation structure 25 is physically and electrically connected to the doped region 18. The deep trench isolation structure 25 penetrates through the full thickness T3 of the dielectric layer 30 and the full thickness T1 of the semiconductor layer 20, and the contacts 42 are electrically and physically connected by the conductor layer 28 to the doped region 18.

The single-photon avalanche diode has a separate absorption, charge, and multiplication (SACM) design. In use, incident radiation is absorbed in the absorption region of the single-photon avalanche diode defined by the light-absorbing layer 32, and signal amplification occurs in the multiplication region defined by the portion of the semiconductor layer 20 interior of the deep trench isolation structure 25. The single-photon avalanche diode is biased above the avalanche breakdown voltage. The doped region 22 provides a charge sheet used to control the electric field so that the electric field is high enough in the multiplication region to ensure that avalanche breakdown is reached and low enough in the absorption region to prevent tunneling. When an incident photon is absorbed in the absorption region, an electron-hole pair is created, and the electron drifts into the multiplication region. An avalanche current is generated in the multiplication region by the creation of additional electron-hole pairs through impact ionization. The collected avalanche current provides a detectable electronic signal that can be output from the single-photon avalanche diode in a current path through the doped region 18 and the deep trench isolation structure 25.

The deep trench isolation structure 25 is heightened and the contacts 42 are shortened compared to conventional single-photon avalanche diodes in which the deep trench isolation region is coplanar with the top surface 21 of the semiconductor layer 20 and the contacts 42 to the doped region 18 are taller to accommodate the shorter and lower deep trench isolation region. The height of the contacts 42 coupled to the cathode of the single-photon avalanche diode and the height of the contacts 44 coupled to the anode of the single-photon avalanche diode are either equal or substantially equal, which eliminates fabrication difficulties associated with the taller contacts found in conventional single-photon avalanche diodes. The contacts 42 and the contacts 44 may be formed using the same lithography mask, the same etching process, and the same conductor deposition, which contrasts with conventional formation processes that require separate masks, separate etch processes, and separate deposition processes due to the height disparity between the contacts coupled to the anode and the contacts coupled to the cathode.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, the language of approximation may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a single-photon avalanche diode, the structure comprising:
   a semiconductor substrate having a top surface;
   a semiconductor layer on the top surface of the semiconductor substrate;
   a light-absorbing layer on a first portion of the semiconductor layer;
   a dielectric layer on a second portion of the semiconductor layer;
   a first doped region in the semiconductor substrate adjacent to the semiconductor layer; and
   a deep trench isolation structure that penetrates through the dielectric layer and the second portion of the semiconductor layer to the first doped region, the deep trench isolation structure including a conductor layer and a dielectric liner, the dielectric liner including a first portion between the conductor layer and the semiconductor layer, and the conductor layer connected to the first doped region.

2. The structure of claim 1 wherein the conductor layer of the deep trench isolation structure has a top surface, the light-absorbing layer has a top surface, and the top surface of the conductor layer is substantially coplanar with the top surface of the light-absorbing layer.

3. The structure of claim 2 wherein the dielectric layer has a top surface, and the top surface of the dielectric layer is substantially coplanar with the top surface of the light-absorbing layer.

4. The structure of claim 1 wherein the dielectric layer has a top surface, and further comprising:
   an interlayer dielectric layer on the top surface of the dielectric layer;
   a first contact that penetrates through the interlayer dielectric layer to the conductor layer; and
   a second contact that penetrates through the interlayer dielectric layer to the light-absorbing layer.

5. The structure of claim 4 wherein the first contact is disposed fully above the top surface of the dielectric layer.

6. The structure of claim 4 wherein the first contact has a first height, and the second contact has a second height that is substantially equal to the first height.

7. The structure of claim 6 wherein the interlayer dielectric layer has a thickness, and the first height is equal to the thickness.

8. The structure of claim 6 wherein the interlayer dielectric layer has a thickness, and the second height is substantially equal to the thickness.

9. The structure of claim 4 further comprising:

a second doped region having a first portion in the light-absorbing layer, wherein the second contact is coupled to the second doped region, the first doped region is a cathode of the single-photon avalanche diode, and the second doped region is an anode of the single-photon avalanche diode.

10. The structure of claim 9 wherein the light-absorbing layer comprises a first material, and further comprising:

a cap layer on the light-absorbing layer, the cap layer comprising a second material different from the first material, wherein the second doped region has a second portion in the cap layer, and the second contact adjoins the cap layer.

11. The structure of claim 4 further comprising:

a silicide layer on the conductor layer of the deep trench isolation structure, the silicide layer disposed between the first contact and the conductor layer.

12. The structure of claim 1 wherein the deep trench isolation structure includes a first portion that fully surrounds the light-absorbing layer.

13. The structure of claim 12 wherein the deep trench isolation structure includes a second portion that fully surrounds the first portion and the second portion of the semiconductor layer.

14. The structure of claim 1 wherein the deep trench isolation structure includes a trench that extends through the conductor layer and the dielectric layer to a portion of the first doped region, and the conductor layer is disposed inside the trench.

15. The structure of claim 1 wherein the dielectric liner includes a second portion disposed between the conductor layer and the dielectric layer.

16. The structure of claim 1 wherein the dielectric layer has a top surface, and the deep trench isolation structure is positioned between the top surface of the semiconductor substrate and the top surface of the dielectric layer.

17. The structure of claim 1 wherein the semiconductor layer has a first thickness, the dielectric layer has a second thickness, and the deep trench isolation structure has a height that is substantially equal to a sum of the first thickness and the second thickness.

18. The structure of claim 1 wherein the light-absorbing layer comprises a semiconductor material.

19. The structure of claim 1 wherein the conductor layer comprises doped polysilicon, metal, or a combination of doped polysilicon and metal.

20. A method of forming a structure for a single-photon avalanche diode, the method comprising:

forming a semiconductor layer on a top surface of a semiconductor substrate;

forming a light-absorbing layer on a first portion of the semiconductor layer;

forming a dielectric layer on a second portion of the semiconductor layer;

forming a doped region in the semiconductor substrate adjacent to the semiconductor layer; and forming a deep trench isolation structure that penetrates through the dielectric layer and the second portion of the semiconductor layer to the doped region, wherein the deep trench isolation structure includes a conductor layer and a dielectric liner including a portion between the conductor layer and the semiconductor layer, and the conductor layer is connected to the doped region.

* * * * *